(12) United States Patent
Sun et al.

(10) Patent No.: US 10,211,048 B2
(45) Date of Patent: Feb. 19, 2019

(54) EPITAXY TECHNIQUE FOR REDUCING THREADING DISLOCATIONS IN STRESSED SEMICONDUCTOR COMPOUNDS

(71) Applicant: Sensor Electronic Technology, Inc., Columbia, SC (US)

(72) Inventors: Wenhong Sun, Columbia, SC (US); Rakesh Jain, Columbia, SC (US); Jinwei Yang, Columbia, SC (US); Maxim S. Shatalov, Columbia, SC (US); Alexander Dobrinsky, Rhode Island, NY (US); Remigijus Gaska, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 336 days.

(21) Appl. No.: 13/756,806

(22) Filed: Feb. 1, 2013

(65) Prior Publication Data

US 2013/0193480 A1  Aug. 1, 2013

Related U.S. Application Data

(60) Provisional application No. 61/593,426, filed on Feb. 1, 2012.

(51) Int. Cl.
*H01L 21/02* (2006.01)
*H01L 29/06* (2006.01)
(Continued)

(52) U.S. Cl.
CPC .... *H01L 21/02587* (2013.01); *H01L 21/0242* (2013.01); *H01L 21/0254* (2013.01);
(Continued)

(58) Field of Classification Search
CPC .......... H01L 21/0242; H01L 21/02458; H01L 21/02507; H01L 21/0254; H01L 21/02587;
(Continued)

(56) References Cited

U.S. PATENT DOCUMENTS

| | | | |
|---|---|---|---|
| 5,306,924 A | 4/1994 | Usami et al. | |
| 5,880,491 A * | 3/1999 | Soref | B82Y 20/00 |
| | | | 257/18 |

(Continued)

FOREIGN PATENT DOCUMENTS

| | | |
|---|---|---|
| CN | 101277563 A | 10/2008 |
| JP | 2010153450 | 8/2010 |

(Continued)

OTHER PUBLICATIONS

Mathis et al., "Modeling of threading dislocation reduction in growing GaN layers", Journal of Crystal Growth 231 (2001) pp. 371-390.*

(Continued)

*Primary Examiner* — Ori Nadav
(74) *Attorney, Agent, or Firm* — LaBatt, LLC

(57) ABSTRACT

A solution for fabricating a semiconductor structure is provided. The semiconductor structure includes a plurality of semiconductor layers grown over a substrate using a set of epitaxial growth periods. During each epitaxial growth period, a first semiconductor layer having one of: a tensile stress or a compressive stress is grown followed by growth of a second semiconductor layer having the other of: the tensile stress or the compressive stress directly on the first semiconductor layer. One or more of a set of growth conditions, a thickness of one or both of the layers, and/or a lattice mismatch between the layers can be configured to create a target level of compressive and/or shear stress (Continued)

within a minimum percentage of the interface between the layers.

17 Claims, 12 Drawing Sheets

(51) Int. Cl.
H01L 33/00 (2010.01)
H01L 33/12 (2010.01)
H01L 33/16 (2010.01)

(52) U.S. Cl.
CPC .... *H01L 21/0262* (2013.01); *H01L 21/02458* (2013.01); *H01L 21/02507* (2013.01); *H01L 29/0684* (2013.01); *H01L 33/0075* (2013.01); *H01L 33/12* (2013.01); *H01L 33/16* (2013.01)

(58) Field of Classification Search
CPC ............. H01L 21/0262; H01L 29/0684; H01L 33/0075; H01L 33/12; H01L 33/16
USPC ........................................................ 257/183
See application file for complete search history.

(56) References Cited

U.S. PATENT DOCUMENTS

| | | | |
|---|---|---|---|
| 6,472,695 B1 | 10/2002 | Hall et al. | |
| 6,518,644 B2 | 2/2003 | Fitzgerald | |
| 7,081,410 B2 | 7/2006 | Fitzgerald | |
| 7,312,474 B2 | 12/2007 | Emerson et al. | |
| 7,811,847 B2 | 10/2010 | Hirayama et al. | |
| 7,888,154 B2 | 2/2011 | Hirayama et al. | |
| 8,236,672 B2 | 8/2012 | Chinone et al. | |
| 2001/0024871 A1* | 9/2001 | Yagi | C23C 16/303 438/604 |
| 2002/0005514 A1* | 1/2002 | Fitzgerald | 257/19 |
| 2002/0020850 A1* | 2/2002 | Shibata | H01L 21/0242 257/183 |
| 2002/0079502 A1* | 6/2002 | Ishibashi | B82Y 20/00 257/89 |
| 2004/0219702 A1 | 11/2004 | Nagai et al. | |
| 2005/0045895 A1* | 3/2005 | Emerson | H01L 21/0237 257/96 |
| 2005/0045905 A1 | 3/2005 | Chu et al. | |
| 2006/0160345 A1* | 7/2006 | Liu | H01L 21/0242 438/604 |
| 2007/0231488 A1* | 10/2007 | Von Kaenel | C23C 16/0209 427/255.15 |
| 2008/0153191 A1 | 6/2008 | Grillot et al. | |
| 2008/0274268 A1 | 11/2008 | Ogino | |
| 2009/0057646 A1* | 3/2009 | Hirayama | H01L 21/0237 257/13 |
| 2009/0200645 A1 | 8/2009 | Kokawa et al. | |
| 2009/0239357 A1* | 9/2009 | Amano | C30B 25/02 438/478 |
| 2010/0230713 A1 | 9/2010 | Minemoto et al. | |
| 2010/0244087 A1* | 9/2010 | Horie | C30B 25/02 257/103 |
| 2010/0252834 A1 | 10/2010 | Lee et al. | |
| 2010/0252835 A1* | 10/2010 | Horie | C30B 25/02 257/76 |
| 2010/0264460 A1* | 10/2010 | Grandusky | H01L 21/02389 257/190 |
| 2011/0037097 A1 | 2/2011 | Scott et al. | |
| 2011/0177678 A1* | 7/2011 | Ohno | B82Y 20/00 438/478 |
| 2011/0266520 A1 | 11/2011 | Shur et al. | |

FOREIGN PATENT DOCUMENTS

| | | |
|---|---|---|
| KR | 100363241 | 2/2003 |
| KR | 1020100033644 | 3/2010 |
| KR | 1020100100567 | 9/2010 |

OTHER PUBLICATIONS

Akasheh, et al., "Multiscale Modeling and Simulation of Deformation in Nanoscale Metallic Multilayered Composites" (ch. 6 of Kwon et al., Multiscale Modeling and Simulation of Composite Materials and Structures, Springer, New York, 2008).*

Haeberlen et al., Dislocation reduction in MOVPE grown GaN layers on (111)Si using SiNx and AlGaN layers, Journal of Physics: Conference Series 209, 2010, pp. 1-4, IOP Publishing.

Yamaguchi et al., Metalorganic vapor phase epitaxy growth of crack-free AlN on GaN and its application to high-mobility AlN/GaN superlattices, Applied Physics Letters, Nov. 2001, pp. 3062-3064, vol. 79 No. 19, American Institute of Physics.

Yamaguchi et al., Control of strain in GaN by a combination of H2 and N2 carrier gases, Journal of Applied Physics, Jun. 2001, pp. 7820-7824, vol. 89 No. 12, American Institute of Physics.

Sang et al., Reduction in threading dislocation densities in AlN epilayer by introducing a pulsed atomic-layer epitaxial buffer layer, Applied Physics Letters, 2008, pp. 122104-1-122104-3, American Institute of Physics.

Reentila et al., Effect of the AlN nucleation layer growth on AlN material quality, Journal of Crystal Growth, 2008, pp. 4932-4934, Elsevier B.V.

Ponchet et al., Lateral modulations in zeronetstrained GaInAsP multilayers grown by gas source molecularbeam epitaxy, Journal of Applied Physics, 1993, pp. 3778-3782, American Institute of Physics.

Okada et al., Growth of high-quality and crack free AlN layers on sapphire substrate by multi-growth mode modification, Journal of Crystal Growth, 2007, pp. 349-353, Elsevier B.V.

Morkoc, Thermal Mismatch Induced Strain, Handbook of Nitride Semiconductors and Devices, 2008, pp. 290-292, vol. 1, Wiley-VCH Verlag GmbH & Co. KGaA.

Ohba et al., Growth of AlN on sapphire substrates by using a thin AlN bu!er layer grown two-dimensionally at a very low V/III ratio, Journal of Crystal Growth, 2000, pp. 258-261, Elsevier Science B.V.

Mitrofanov et al., High quality UV AlGaN/AlGaN distributed Bragg reflectors and microcavities, Gallium Nitride Materials and Devices II, 2007, pp. 64731G-1-64731G-5, vol. 6473, SPIE.

Zhang et al., Growth of Highly Conductive n-Type Al0:7Ga0:3N Film by Using AlN Buffer with Periodical Variation of V/III Ratio, Chinese Phys. Lett., 2008, pp. 4449-4452, vol. 25 No. 12, Chinese Physical Society and IOP Publishing Ltd.

Imura, et al., High-Temperature Metal-Organic Vapor Phase Epitaxial Growth of AlN on Sapphire by Multi Transition Growth Mode Method Varying V/III Ratio, Japanese Journal of Applied Physics, 2006, pp. 8639-8643, vol. 45 No. 11, The Japan Society of Applied Physics.

Hsu et al., Growth and characteristics of self-assembly defect-free GaN surface islands by molecular beam epitaxy., Apr. 2011,1 page, J Nanosci Nanotechnol.

Figge et al., In situ and ex situ evaluation of the film coalescence for GaN growth on GaN nucleation layers, Journal of Crystal Growth, 2000, pp. 262-266, Elsevier Science B.V.

Dridi et al., First-principles investigation of lattice constants and bowing parameters in wurtzite AlxGa1—xN, InxGa1—xN and InxAl1—xN alloys, Semiconductor Science and Technology, 2003, pp. 850-856, Institute of Physics Publishing.

Dimitrakopulos et al., Strain accommodation and interfacial structure of AlN interlayers in GaN, Cryst. Res. Technol., 2009, pp. 1170-1180, No. 10, Wiley-VCH Verlag GmbH & Co. KGaA, Weinheim.

Zhang et al., Improvement of AlN Film Quality by Controlling the Coalescence of Nucleation Islands in Plasma-Assisted Molecular Beam Epitaxy, Chinese Phys. Lett., 2010, pp. 058101-1-058101-3, vol. 27 No. 5, Chinese Physical Society and IOP Publishing Ltd.

Acord et al., In situ stress measurements during MOCVD growth of AlGaN on SiC, Journal of Crystal Growth, 2004, pp. 65-71, Elsevier B.V.

Yoshikawa et al., A New "Three-Step Method" for High Quality MOVPE Growth of III-Nitrideson Sapphire, phys. stat. sol., 2001, pp. 625-628, No. 2, Wiley-VCH Verlag Berlin GmbH.

(56) References Cited

OTHER PUBLICATIONS

Hirayama et al., 231-261nm AlGaN deep-ultraviolet light-emitting diodes fabricated on AlN multilayer buffers grown by ammonia pulse-flow method on sapphire, Applied Physics Letters, 2007, pp. 071901-1-071901-3, American Institute of Physics.

Zhang et al., Pulsed atomic layer epitaxy of quaternary AlInGaN layers, Applied Physics Letters, Aug. 2001, pp. 925-927, vol. 79 No. 7, American Institute of Physics.

Zhang et al., Crack-free thick AlGaN grown on sapphire using AlN/AlGaN superlattices for strain management, Applied Physics Letters, May 2002, pp. 3542-3544, vol. 80 No. 19, American Institute of Physics.

Nishinaga et al., Epitaxial Lateral Overgrowth of GaAs by LPE, Japanese Journal of Applied Physics, Jun. 1988, pp. L964-L967, vol. 27 No. 6.

Bai et al., Reduction of threading dislocation densities in AlN/sapphire epilayers driven by growth mode modification, Applied Physics Letters, 2006, pp. 051903-1-051903-3, American Institute of Physics.

Choi, International Search Report and Written Opinion for International Application No. PCT/US2012/067590, dated Mar. 26, 2013, 11 pages.

Choi, International Search Report and Written Opinion for International Application No. PCT/US2013/024310, dated May 15, 2013, 9 pages.

Office Action for Application No. 13692191, dated Jun. 20, 2014, 18 pages.

Final Office Action for Application No. 13692191, dated Jan. 23, 2015, 17 pages.

Webb, V., U.S. Appl. No. 13/692,191, Non-Final Office Action 2, dated Sep. 9, 2015, 29 pgs.

Webb, V., U.S. Appl. No. 13/692,191, Final Office Action 2, dated May 19, 2016, 21 pgs.

Jinzhu, C., Application No. 201380013532.2, Office Action—English translation, dated Apr. 7, 2016, 6 pages.

Jinzhu, C., Application No. 201380013532.2, Office Action2 with English translation, dated Dec. 2, 2016, 15 pages.

Jinzhu, C., Application No. 201380013532.2, Notification of Reexamination, Board Opinion (with English translation), dated Jan. 24, 2018, 12 pages.

Jinzhu, C., Application No. 201380013532.2, Rejection Decision (with English translation), dated Apr. 13, 2017, 10 pages.

Picardat, K., U.S. Appl. No. 15/391,922, Notice of Allowance, dated Aug. 6, 2018, 15 pages.

Webb, V., U.S. Appl. No. 13/692,191, Notice of Allowance, dated Aug. 1, 2017, 22 pages.

Picardat, K., U.S. Appl. No. 15/391,922, Non-Final Office Action1, dated Jun. 16, 2017, 20 pages.

Picardat. K., U.S. Appl. No. 16/021,347, Office Action 1, dated Oct. 4, 2018, 5 pages.

* cited by examiner

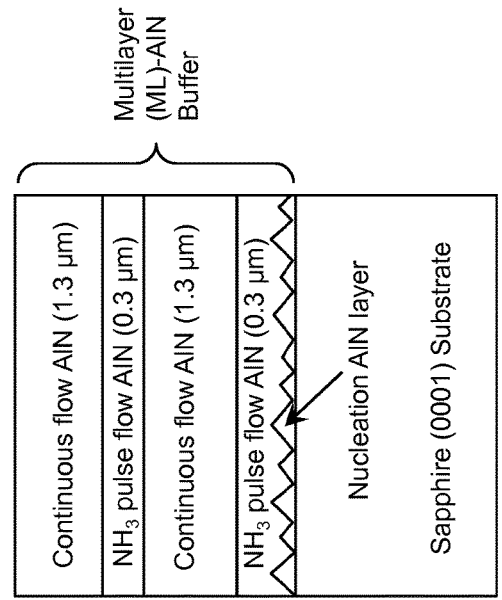
FIG. 1B *Prior Art*
FIG. 1C *Prior Art*
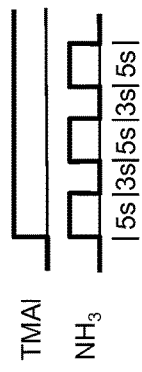
FIG. 1A *Prior Art*

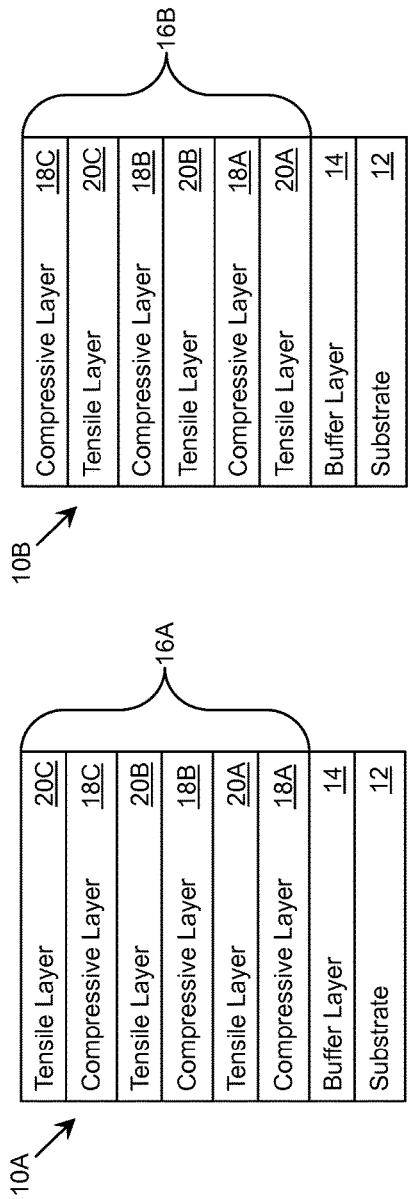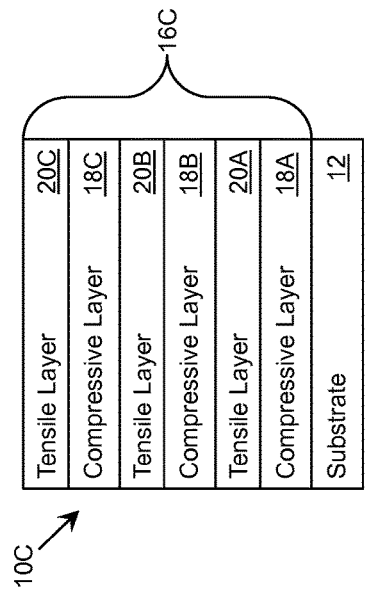

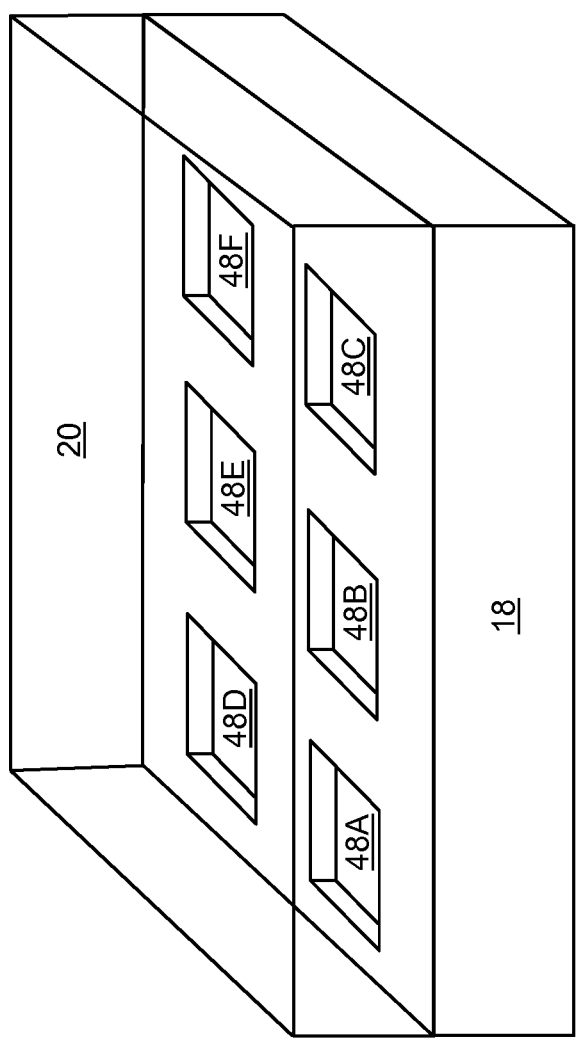

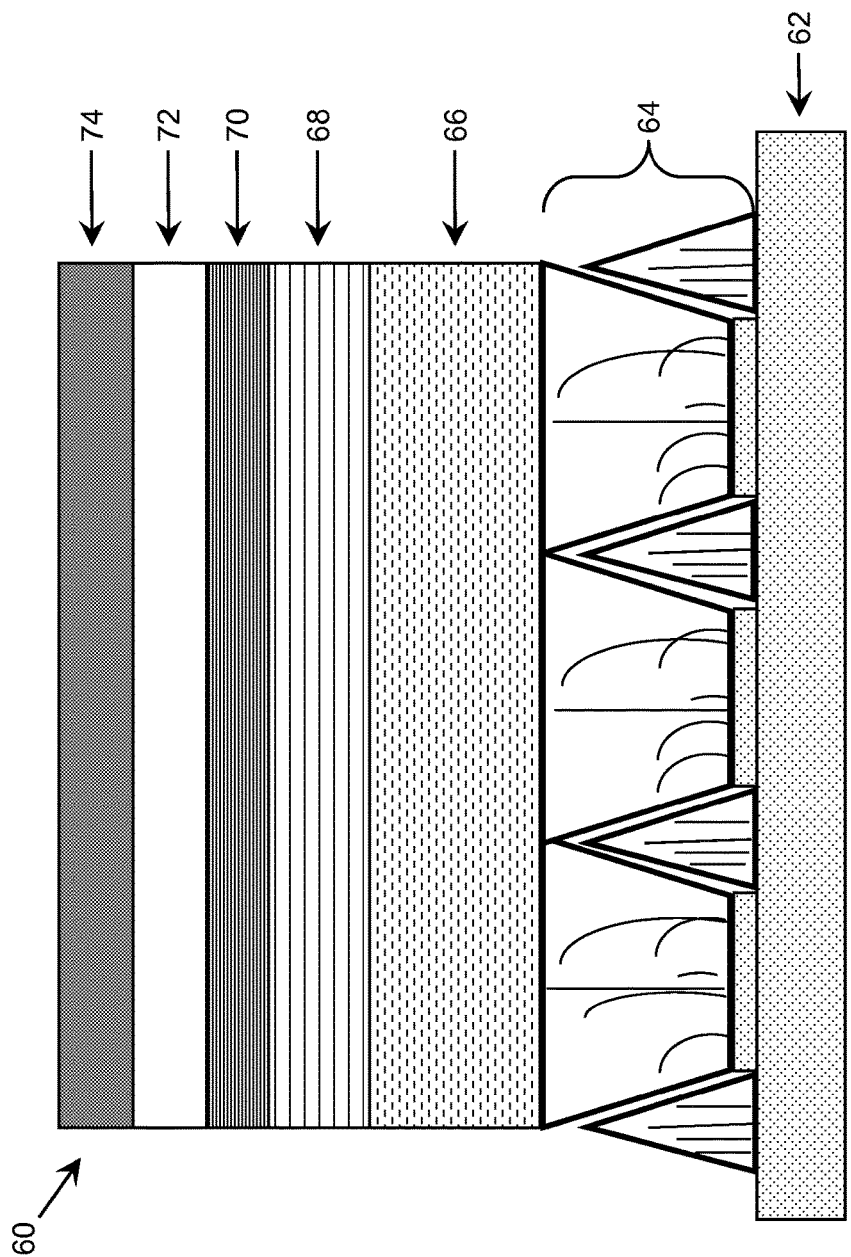

EPITAXY TECHNIQUE FOR REDUCING THREADING DISLOCATIONS IN STRESSED SEMICONDUCTOR COMPOUNDS

REFERENCE TO RELATED APPLICATIONS

The current application claims the benefit of U.S. Provisional Application No. 61/593,426, titled "Epitaxy Technique for Reduction of Threading Dislocations in Stressed Nitride-Based Semiconductor Compounds," which was filed on 1 Feb. 2012, and which is hereby incorporated by reference. Aspects of the invention are related to U.S. patent application Ser. No. 13/692,191, titled "Epitaxy Technique for Growing Semiconductor Compounds," which was filed on 3 Dec. 2012, and which is hereby incorporated by reference.

GOVERNMENT LICENSE RIGHTS

This invention was made with government support under contract no. W911 NF-10-2-0023 awarded by the Defense Advanced Research Projects Agency (DARPA). The government has certain rights in the invention.

TECHNICAL FIELD

The disclosure relates generally to growing semiconductor compounds, and more particularly, to an epitaxy technique for such growth, which can result in a semiconductor compound with a low dislocation density.

BACKGROUND ART

For light emitting devices, such as light emitting diodes (LEDs) and especially deep ultraviolet LEDs (DUV LEDs), minimizing a dislocation density and a number of cracks in the semiconductor layers increases the efficiency of the device. To this extent, several approaches have sought to grow low-defect semiconductor layers on patterned substrates. These approaches typically rely on reducing stresses present in epitaxially grown semiconductor layers.

For example, one approach to reduce stress accumulation in an epitaxially grown layer relies on patterning the underlying substrate using microchannel epitaxy (MCE). Using MCE, a narrow channel is used as a nucleation center containing low defect information from the substrate. An opening in a mask acts as a microchannel, which transfers crystal information to the overgrown layer, while the mask prevents dislocations from transferring to the overgrown layer. As a result, the overgrown layer can become dislocation free. The three-dimensional structure of the MCE also provides another advantage to stress release. The residual stress can be released effectively since the overgrown layer easily deforms. In another approach, a mask is applied at a location of a large concentration of dislocation densities to block their further propagation.

Other approaches rely on epitaxially growing a group III nitride based semiconductor superlattice. The superlattice structure mitigates the strain difference between an aluminum nitride (AlN)/sapphire template and the subsequent thick $Al_xGa_{1-x}N$ (where $0 \leq x \leq 1$) layers. For devices such as DUV LEDs, thick AlGaN epitaxial layers (e.g., of the order of a few micrometers) are desirable to reduce current crowding. Using a superlattice approach, an AlN/AlGaN superlattice was grown to reduce biaxial tensile strain and a 3.0-µm-thick $Al_{0.2}Ga_{0.8}N$ was grown on sapphire without any cracks. Similarly, a superlattice structure shown in FIG. 1A can comprise a periodic structure with each element 2A-2D composed of alternating sublayers of semiconductor materials with different polarizations and different accumulated stresses in the sublayers. Such a superlattice can be used to minimize the dislocation density due to varying stresses in the sublayers of the superlattice elements.

While the superlattice approaches allow some control of tensile and compressive stresses in epitaxially grown nitride semiconductor layers, the approaches do not enable epitaxial growth of nitride based semiconductor layers with uniform composition. To grow such layers, variation of nitrogen and aluminum vacancies has been explored. For example, a migration enhanced metalorganic chemical vapor deposition epitaxial growth technique (with an $NH_3$ pulse-flow) can be used to grow high-quality AlN layers. Variation of growth modes can be used to reduce threading dislocations. Additionally, FIGS. 1B and 1C illustrate another approach for fabricating AlN multilayer buffers according to the prior art. In particular, FIG. 1B shows the gas flow sequence used for $NH_3$ pulse-flow growth, while FIG. 1C shows a schematic structure of the AlN buffer. In a first step, an AlN nucleation layer and an initial AlN layer are deposited using $NH_3$ pulse-flow growth. A low threading dislocation density was achieved by a coalescence process of the AlN nucleation layer. For example, as observed from a cross-sectional transmission electron microscope (TEM) image, edge-type and screw-type dislocation densities of an AlGaN layer on an AlN buffer layer were reported as $3.2 \times 10^9$ and $3.5 \times 10^8$ $cm^{-2}$, respectively.

SUMMARY OF THE INVENTION

Aspects of the invention provide a solution for fabricating a semiconductor structure. The semiconductor structure includes a plurality of semiconductor layers grown over a substrate using a set of epitaxial growth periods. During each epitaxial growth period, a first semiconductor layer having one of: a tensile stress or a compressive stress is grown followed by growth of a second semiconductor layer having the other of: the tensile stress or the compressive stress directly on the first semiconductor layer. One or more of a set of growth conditions, a thickness of one or both of the layers, and/or a lattice mismatch between the layers can be configured to create a target level of compressive and/or shear stress within a minimum percentage of the interface between the layers. The target level of compressive and/or shear stress can be selected based on an amount of shear stress sufficient to turn a minimum set of dislocations in the layer from a direction primarily in a direction of a c-axis to a direction primarily in a c-plane of the layer.

A first aspect of the invention provides a method of fabricating a semiconductor structure, the method comprising: growing a plurality of semiconductor layers over a substrate using a set of epitaxial growth periods, wherein each epitaxial growth period includes: epitaxially growing a first semiconductor layer having one of: a tensile stress or a compressive stress; and epitaxially growing a second semiconductor layer having the other of: the tensile stress or the compressive stress directly on the first semiconductor layer, wherein a change in a set of growth conditions between the first and second semiconductor layers causes at least ten percent of an area of an interface between the first and second semiconductor layers to have a shear stress that is greater than a shear stress present between two group III nitride semiconductor layers having a lattice mismatch of at least 0.01%.

A second aspect of the invention provides a semiconductor structure including: a substrate; and a plurality of semiconductor layers on the substrate, the plurality of semiconductor layers including a set of periods, each period including: a first semiconductor layer, wherein the first semiconductor layer has one of: a tensile stress or a compressive stress; and a second semiconductor layer directly on the first semiconductor layer, wherein the second semiconductor layer has the other of: the tensile stress or the compressive stress, wherein a change in a set of growth conditions between the first and second semiconductor layers causes at least ten percent of an area of an interface between the first and second semiconductor layers to have a shear stress that is greater than a shear stress present between two group III nitride semiconductor layers having a lattice mismatch of at least 0.01%.

A third aspect of the invention provides a method of fabricating a semiconductor structure, the method comprising: growing a plurality of group III nitride semiconductor layers over a substrate using a set of epitaxial growth periods, wherein each epitaxial growth period includes: epitaxially growing a first group III nitride semiconductor layer having one of: a tensile stress or a compressive stress; and epitaxially growing a second group III nitride semiconductor layer having the other of: the tensile stress or the compressive stress directly on the first semiconductor layer, wherein the epitaxially growing the first semiconductor layer and the epitaxially growing the second semiconductor layer use molar ratios of group V precursors to group III precursors that differ by at least ten percent, and wherein at least one of: a thickness of at least one of the first or second semiconductor layers, a lattice mismatch between the first and second semiconductor layers, or a change in a set of growth conditions between the first and second semiconductor layers is selected to create a shear stress in at least ten percent of an area of an interface between the first and second semiconductor layers sufficient to turn a minimum percentage of dislocations in the first semiconductor layer from a direction primarily in a direction of a c-axis to a direction primarily in a c-plane of the at least one of the first or second semiconductor layers.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 1A-1C show approaches for reducing dislocation density according to the prior art.

FIGS. 4A-4C show illustrative structures according to embodiments.

FIGS. 8A and 8B show illustrative patterns of a surface of a compressive layer with a tensile layer grown thereon according to embodiments.

FIG. 10 shows a schematic of an illustrative device heterostructure according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 2:
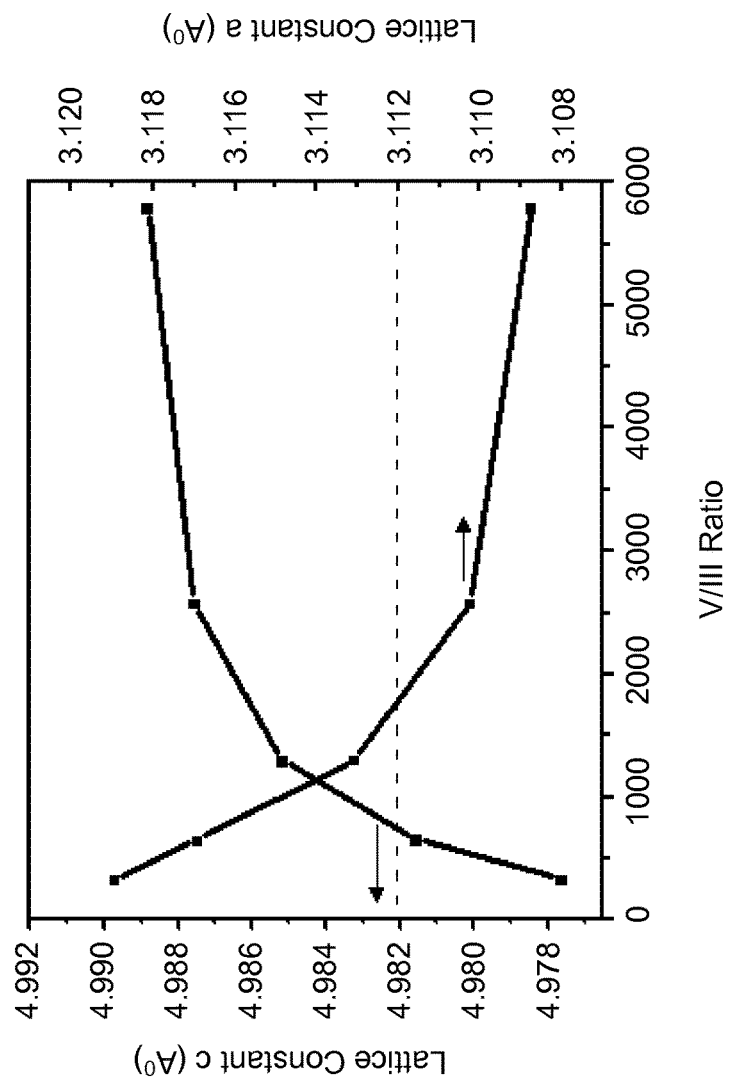
FIG. 2 shows illustrative plots of the lattice constants a and c as a function of the V/III ratio for a group III nitride layer according to an embodiment.

The inventors recognize that, while a reduction of the compressive and tensile stresses is beneficial to an overall reduction of dislocations, the presence of these stresses can lead to dislocation bending and conversion. For example, compressive or tensile stress due to misfit strain can create forces that drive or bend the dislocations towards the crystal boundaries. The inventors propose to exploit such stress to reduce a threading dislocation density in a semiconductor compound. In an embodiment, a nitride-based semiconductor layer with a uniform composition is grown on a lattice mismatched substrate (e.g., sapphire, silicon carbide, and/or the like) using a self-assembly strain-modulated (SASM) growth process, which includes modulating the internal strain in one or more of the corresponding epilayers such that at least a portion of the threading dislocations will turn from a direction primarily of a c-axis to a direction primarily in a c-plane of the layer.

As indicated above, aspects of the invention provide a solution for fabricating a semiconductor structure. The semiconductor structure includes a plurality of semiconductor layers grown over a substrate using a set of epitaxial growth periods. During each epitaxial growth period, a first semiconductor layer having one of: a tensile stress or a compressive stress is grown followed by growth of a second semiconductor layer having the other of: the tensile stress or the compressive stress directly on the first semiconductor layer. One or more of a set of growth conditions, a thickness of one or both of the layers, and/or a lattice mismatch between the layers can be configured to create a target level of compressive and/or shear stress within a minimum percentage of the interface between the layers. The target level of compressive and/or shear stress can be selected based on an amount of shear stress sufficient to turn a minimum set of dislocations in the layer from a direction primarily in a direction of a c-axis to a direction primarily in a c-plane of the layer. In this manner, the semiconductor structure can have a reduced number of cracks and/or threading dislocations than prior art approaches. As used herein, unless otherwise noted, the term "set" means one or more (i.e., at least one) and the phrase "any solution" means any now known or later developed solution.

Aspects of the invention are directed to the growth of semiconductor layers on a substrate. In an embodiment, the semiconductor layers are formed of elements selected from the group III-V materials system. In a more particular embodiment, the semiconductor layers are formed of group III nitride materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

The substrate can comprise any type of substrate exhibiting a lattice mismatch with the semiconductor layer grown thereon. To this extent, the substrate can have a lattice constant that is different from a lattice constant corresponding to one of the semiconductor layers epitaxially grown thereon. As used herein, a substrate is lattice mismatched with a semiconductor layer when the lattice constants differ by more than one percent (e.g., as calculated by the lattice constant of the semiconductor layer minus the lattice constant of the substrate divided by the lattice constant of the semiconductor layer). In an embodiment, the substrate is an insulating material, such as sapphire or silicon carbide (SiC). However, the substrate can comprise any suitable material, such as silicon (Si), a nitride substrate (e.g., AlN, GaN, BN, AlGaN, and/or the like), an oxide substrate (e.g., aluminum oxynitride, zinc oxide (ZnO), lithium gallate ($LiGaO_2$), lithium aluminate ($LiAlO_2$), magnesium aluminate ($MgAl_2O_4$), scandium magnesium aluminum oxide ($ScMgAlO_4$), and/or the like), and/or other related materials.

The layer(s) grown as described herein can be implemented as part of any type of semiconductor device. In an embodiment, the semiconductor device is an emitting device. In a more particular embodiment, the emitting device is configured to operate as a light emitting diode (LED), such as a conventional or super luminescent LED. Similarly, the emitting device can be configured to operate as a laser, such as a laser diode (LD). In another embodiment, the semiconductor device is configured to operate as a photodetector, photomultiplier, and/or the like. Regardless, electromagnetic radiation emitted or detected by the device can comprise a peak wavelength within any range of wavelengths, including visible light, ultraviolet radiation, deep ultraviolet radiation, infrared light, and/or the like.

Aspects of the invention utilize an ability to selectively grow a layer exhibiting either tensile or compressive residual stress depending on the deposition conditions. For example, a change in a set of the deposition conditions for growing an aluminum nitride (AlN) epitaxial layer on a foreign substrate can result in the layer exhibiting either tensile or compressive residual stress. In an embodiment, the set of deposition conditions includes a molar ratio of group V precursors to group III precursors (V/III ratio), which can be altered during the growth of a group III-V semiconductor layer.

Whether a layer experiences tensile or compressive stress also can depend on the lattice constant of the layer as compared with the lattice constant of each adjacent layer. For example, a first AlN layer with a lattice constant of 3.110 Angstroms grown on a second AlN layer with a lattice constant of 3.108 Angstroms experiences compressive stresses, while the second AlN layer experiences tensile stresses. To this extent, the V/III ratio, or another growth characteristic of a semiconductor layer, may not determine whether or not the layer experiences tensile or compressive stress by itself. In contrast, the growth and/or lattice parameters of adjacent layer(s) may be required to evaluate the stresses present in a given layer.

Unless specified otherwise, a "tensile layer" is a layer experiencing tensile stress, and a "compressive layer" is a layer experiencing compressive stress. Throughout the text, these are also referred to as layers with tensile or compressive stress correspondingly. Additionally, a layer may experience compressive stress at one region (e.g., the bottom) of the layer and tensile stress at another region (e.g., the top) of the layer. In this case, such a layer is referred as a "mixed stress layer." In general, a "mixed stress layer" is a layer where a sign of the stress changes throughout the layer, in different portions of the layer, and/or the like. It is understood that while a target compressive stress is primarily used to describe illustrative aspects of the invention, it is understood that the target stress can be tensile.

Additional aspects of the invention are shown and described with respect to a default AlN layer grown with a V/III ratio of 1750. Such a layer comprises a lattice constant a of approximately 3.112 Angstroms. To this extent, FIG. 2 shows illustrative plots of the lattice constants a and c as a function of the V/III ratio for a group III nitride layer according to an embodiment. The different lattice constants can result in the layer exerting different tensile and compressive properties when grown adjacent to the default AlN layer. For example, for a group III nitride layer grown using a low V/III ratio (e.g., less than approximately 1750), the lattice constant a for the group III nitride layer is slightly larger than the lattice constant a for the default AlN layer. The difference in the lattice constants a results in the group III nitride layer exerting tensile stresses on the adjacent default AlN layer. For a group III nitride layer grown using a high V/III ratio (e.g., greater than approximately 1750), the lattice constant a for the group III nitride layer is slightly smaller than the lattice constant a for the default AlN layer, which results in compressive stresses being exerted by the group III nitride layer on the adjacent default AlN layer.

Figure 3:
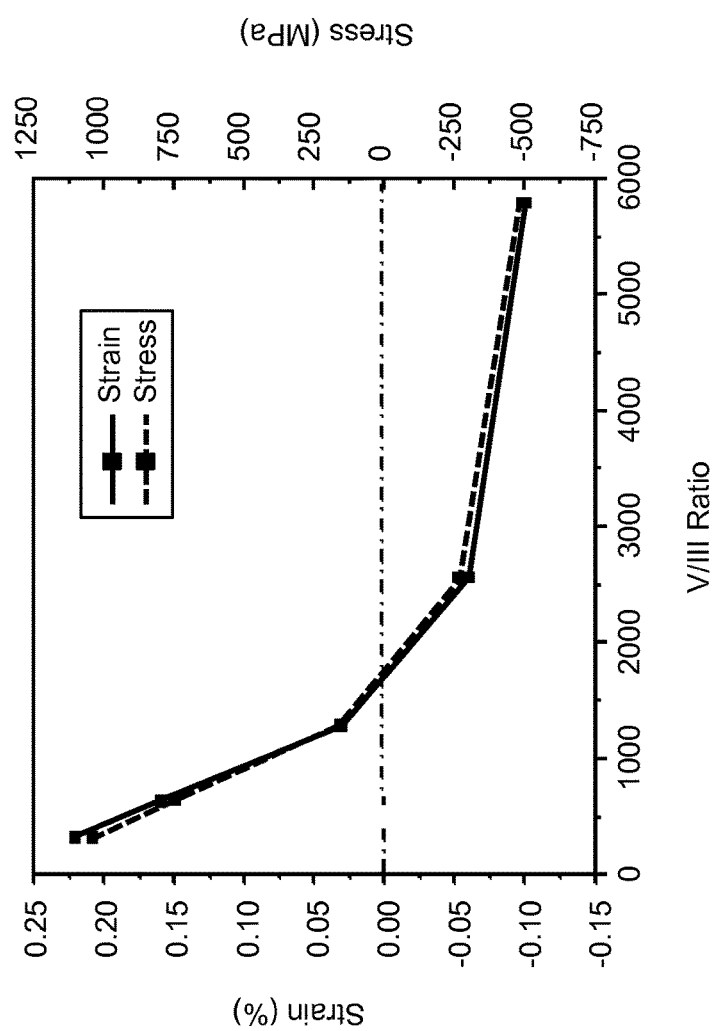
FIG. 3 shows illustrative plots of stress and strain as a function of the V/III ratio for a group III nitride layer according to an embodiment.

FIG. 3 shows illustrative plots of stress and strain as a function of the V/III ratio for a group III nitride layer according to an embodiment. The point of zero strain is chosen to coincide with the default AlN layer having a lattice constant of 3.112 A, which is presumed to be adjacent to the group III nitride layer. All the strains and stresses shown in FIG. 3 are calculated relative to this growth condition. As illustrated, the strain and tensile stresses exerted on the default AlN layer by the group III nitride layer reduce as the V/III ratio is increased, eventually switching from tensile to compressive stress. To this extent, a group III nitride layer grown adjacent to the default AlN layer under a low V/III ratio (e.g., less than approximately 1750) is in compressive stress, while an group III nitride layer grown adjacent to the default AlN layer with a high V/III ratio (e.g., above approximately 1750) is in tensile stress. As further illustrated, only small changes in the strain of the AlN layer are produced by modulating the V/III ratio.

In an embodiment, growth of a semiconductor heterostructure (e.g., a layer), such as a group III-V based heterostructure, includes growth of a series of layers (e.g., films) with alternating tensile and compressive stresses. A layer can be selectively configured to have tensile or compressive stress by modulating a V/III ratio in each layer. For example, the modulation can include varying the V/III ratio according to a set schedule to yield compressive and tensile semiconductor layers. Additionally, one or more additional deposition conditions can be changed, such as a growth temperature, a gas flow, and/or the like. Furthermore, one or more attributes of the layers, such as a relative thickness of a layer, a distribution of stress within each layer, and/or the like, can be adjusted during the growth of the layer. The modulation of the set of deposition conditions can result in regions of increased compressive stresses and regions of increased tensile stress. In this manner, the resulting semiconductor structure can be configured to have a condition of approximately zero (or near zero) overall residual stress.

FIGS. 4A-4C show illustrative structures 10A-100 according to embodiments. Each structure 10A-100 includes a substrate 12, which can be a foreign substrate, such as sapphire, SiC, or the like. Furthermore, the structures 10A, 10B include a buffer layer 14 (e.g., a nucleation layer) grown directly on the substrate 12. The buffer layer 14 can provide a transition to accommodate a large lattice mismatch between the substrate 12 and the subsequent semiconductor heterostructure 16A-16B. In an embodiment, the buffer layer 14 can comprise an $Al_xGa_{1-x}N/Al_yGa_{1-y}N$ superlattice, where $0 \leq x, y \leq 1$. Each superlattice layer can be, for example, up to several nanometers thick. In an embodiment, the layers with differing aluminum content (e.g., denoted by x and y) can have similar thicknesses. In an illustrative embodiment, the buffer layer 14 has a thickness in a range from nearly zero nanometers to approximately 2000 nanometers. In another embodiment, growth of the buffer layer 14 uses a growth temperature between approximately 500 and approximately 1200 degrees Celsius and a growth rate between approximately 0.01 micrometers and approximately 10 micrometers per hour. However, as illustrated by the structure 10C, embodiments of the structure can be formed without the buffer layer 14, e.g., based on the material of the substrate and/or the corresponding lattice mismatch.

Regardless, each of the structures 10A-100 includes a semiconductor heterostructure 16A-16C grown on the substrate 12. Each semiconductor heterostructure 16A-16C is formed of a plurality of compressive layers 18A-18C alternating with a plurality of tensile layers 20A-20C. In the structures 10A, 10C, a compressive layer 18A is first grown, while in the structure 10B, a tensile layer 20A is first grown. While each semiconductor heterostructure 16A-16C is shown including three periods of epitaxial growth (e.g., each period including a compressive and a tensile layer), it is understood that a semiconductor heterostructure can include any number of periods. In an embodiment, the stress changes abruptly between a compressive layer and the adjacent tensile layer. Alternatively, the stress can gradually change between adjacent layers (e.g., by growing layers having a graded tensile or compressive stress). Furthermore, the tensile and compressive stress can be substantially constant between periods of the semiconductor heterostructure 16A-16C or can gradually change from period to period.

The growth of a semiconductor heterostructure 16A-16C, and the growth of the corresponding layers 18A-18C, 20A-20C forming the semiconductor heterostructure 16A-16C, can use any set of deposition conditions. For example, the set of deposition conditions for a layer 18A-18C, 20A-20C can include: a group III precursor flow rate between approximately 0.1 and approximately 200 micromoles per minute; a nitrogen precursor flow rate between approximately 100 and 10000 standard cubic centimeters per minute (SCCM); a pressure between approximately 1 and 760 Torr; a molar ratio of group V precursors to group III precursors (V/III ratio) between approximately 10 and approximately 1000; and a growth temperature between approximately 500 and approximately 1800 degrees Celsius. Furthermore, a layer 18A-18C, 20A-20C can be grown to a thickness that is greater than a critical thickness to avoid pseudomorphic growth. In an embodiment, each layer 18A-18C, 20A-20C has a thickness between approximately one nanometer and five micrometers.

As described herein, during the growth of a semiconductor heterostructure 16A-16C, one or more of a set of the deposition conditions for epitaxially growing a layer 18A-18C, 20A-20C can be changed to cause the resulting layer 18A-18C, 20A-20C to exhibit either tensile or compressive residual stress. For example, the growth of a compressive layer and the growth of a tensile layer can use molar ratios of group V precursors to group III precursors that differ by at least ten percent. In an embodiment, a composition of the compressive layer differs from a composition of the tensile layer by no more than approximately five percent. For example, a fraction of aluminum in the tensile layer can differ from a fraction of aluminum in the compressive layer by no more than approximately five percent. Similarly, the compressive and tensile layers can have a lattice mismatch of at least 0.01% (e.g., the lattice constant of one layer can be different from the lattice constant of another layer by at least 0.0001 Angstroms). Furthermore, a growth rate for the compressive and tensile layers can be changed. In an embodiment, the growth rates for the compressive and tensile layers differ by at least ten percent. A growth temperature for the compressive and tensile layers can be substantially the same or changed. In an embodiment, the growth temperatures for the compressive and tensile layers differ by at least two percent.

Figure 5:
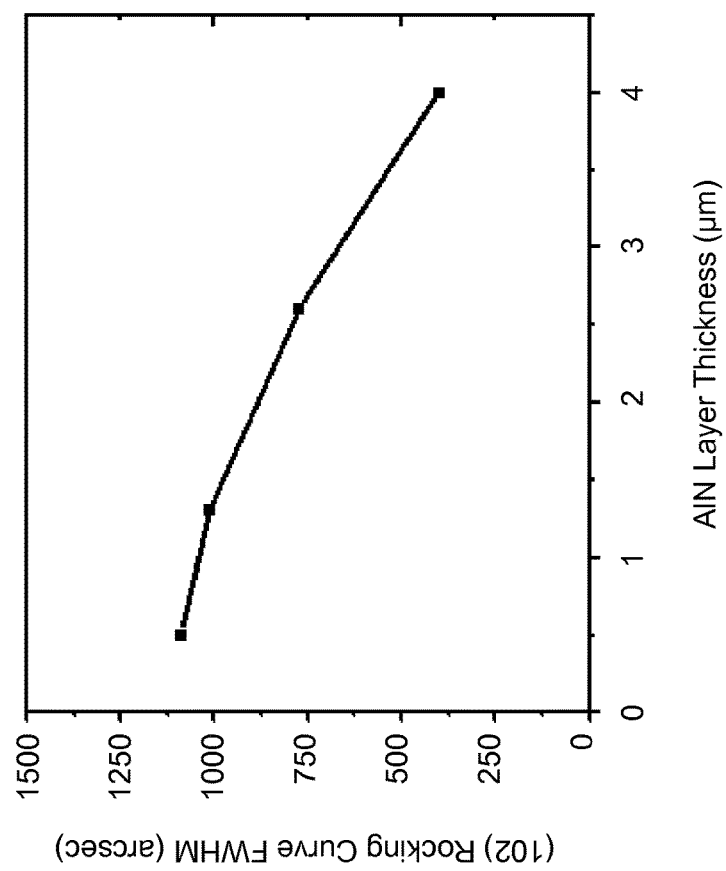
FIG. 5 shows an illustrative plot of a (102) XRD rocking curve FWHM as a function of layer thickness according to an embodiment.

Additionally, analysis of the dislocation density of a layer can include analysis of an X-ray diffraction (XRD) rocking curve, where the full width at half minimum (FWHM) of the (102) lattice plane reflection is related to the dislocation density. To this extent, FIG. 5 shows an illustrative plot of a (102) XRD rocking curve FWHM as a function of layer thickness according to an embodiment. The plot corresponds to an AlN layer grown using strain modulation as described herein. As a illustrated, the AlN (102) XRD rocking curve FWHM is reduced as the layer thickness increases, which indicates a reduction in a density of the edge dislocations.

Figure 6:
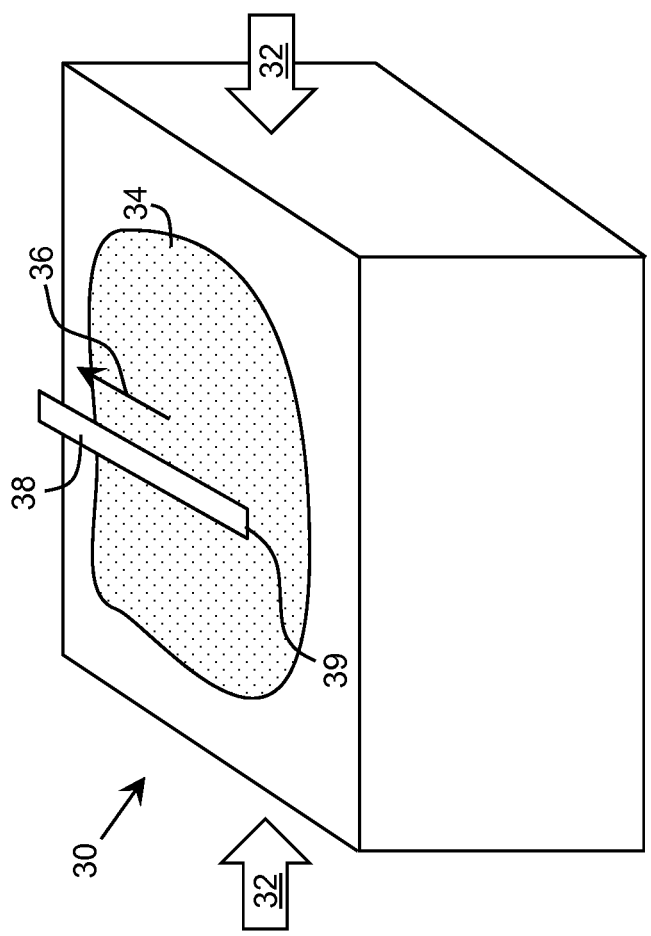
FIG. 6 shows a schematic of an illustrative mechanism for pushing out dislocations from a crystal using misfit stress according to an embodiment.

FIG. 6 shows a schematic of an illustrative mechanism for pushing out dislocations from a crystal 30 using misfit stress 32 according to an embodiment. In an embodiment, the crystal 30 comprises a set of self-assembly strain-modulated (SASM) group III-nitride semiconductor layers, which are periodically grown on a foreign (e.g., lattice mismatched) substrate using a growth process described herein. Such a growth process can include modulating the internal strain in the epilayers. In particular, modulation of a set of deposition conditions, such as temperature, V/III ratio, and/or the like, can produce layers of varying internal strain. The modulation can be configured to generate sufficient shear stress to yield a substantially crack-free group III nitride semiconductor layer with low edge- and screw-dislocation densities. In an embodiment, the growth process includes growing a layer to a thickness sufficient to create a shear stress sufficient to turn a set of threading dislocations in the semiconductor structure from a direction primarily in a direction of the c-axis to a direction primarily in a c-plane of the semiconductor structure. For example, a layer thickness buildup of up to five micrometers resulted in an edge dislocation density rapidly decreasing from $10^{10}/cm^2$ in the proximity of where the group III-nitride layer contacts the substrate to lower than $10^8/cm^2$ at an opposing side of the layer.

Growth of illustrative group III nitride semiconductor layers (e.g., AlN and AlGaN) using a growth procedure described herein were analyzed at various thicknesses using high resolution XRD (HRXRD). The analysis indicated that the compressive stress 32 present in the layer varies with the thickness of the layer. To relieve this stress 32, an edge dislocation can be dissociated into leading and trailing dislocations in the basal plane (e.g., (0001) lattice plane). A buildup in compressive (or tensile) stress 32 results in elevated values of elastic energy 34 in the layers of the crystal 30 and can cause a shear stress 36 in the (0001) lattice plane. The shear stress 36 can push an edge dislocation formed by an extra plane of atoms 38 and having a dislocation core 39 from the prism plane (e.g., (1100) lattice plane) into the (0001) lattice plane during growth.

In an embodiment, a thickness of the one or more of two adjacent layers in the crystal 30 and/or a lattice mismatch between the two layers can be selected based on a target shear stress 36 and/or a target compressive stress 32 within the adjacent layers and/or an interface of the adjacent layers. The thickness(es) and/or lattice mismatches can be selected to cause a desired amount/percentage of edge dislocations to dissociate into leading and trailing dislocations in the basal plane between the bottom of the layers to the top of the layers (e.g., at least an order of magnitude reduction in edge dislocations). In a more particular embodiment, the thickness(es) and/or lattice mismatch creates a target level of compressive stress 32 in a minimum percentage of the layers. In a still more particular embodiment, the minimum percentage of the layers is approximately ten percent and the target level of compressive stress 32 is approximately ten MegaPascal (MPa). In another embodiment, the compressive stress 32 at the interface of two layers is greater than a compressive stress 32 present between two group III nitride semiconductor layers having a lattice mismatch of at least 0.01%. In a more particular embodiment the compressive stress 32 is greater than a compressive stress 32 present between two group III nitride semiconductor layers having a lattice mismatch of at least 0.05%.

A change in the set of growth conditions also can be based on one or more attributes of the materials, such as the elasticity of the materials. For example, the lattice mismatches described herein can generate a target amount of compressive stress 32 between two layers of material having an elasticity corresponding to an elasticity of a group III nitride material with an aluminum molar fraction of at least eighty percent. However, it is understood that the values described herein are only illustrative. To this extent, the minimum percentage and/or target level of compressive stress 32 can vary based on the materials of the layers, a target amount/percentage of edge dislocations dissociating into leading and trailing dislocations in the basal plane, one or more device performance factors for the layers, and/or the like.

Figure 7:
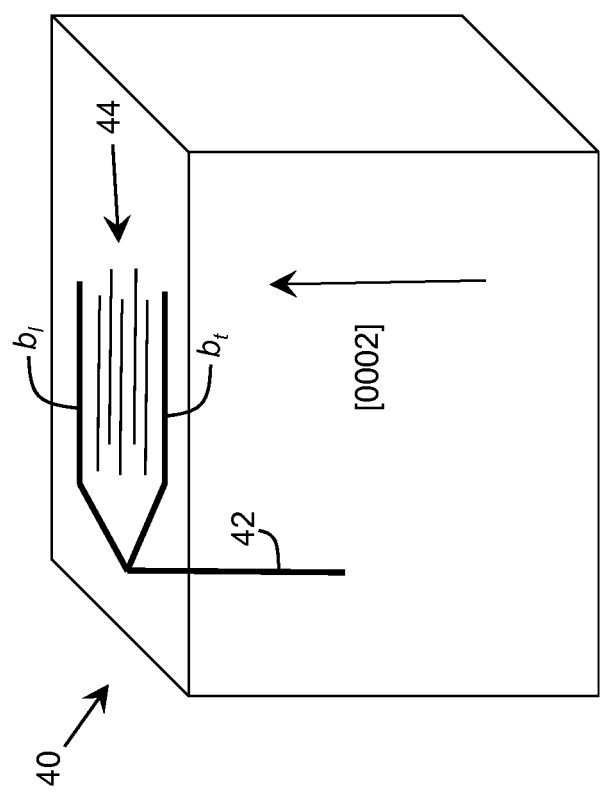
FIG. 7 shows an illustrative schematic of dislocation conversion in a crystal according to an embodiment.

As discussed herein, when an edge dislocation lays in the (0001) lattice plane, it dissociates into partial dislocations in the basal plane. FIG. 7 shows an illustrative schematic of dislocation conversion in a crystal 40 according to an embodiment. As illustrated, an edge dislocation 42 is pushed from the prism plane to the lattice plane, and dissociates into a leading partial dislocation, $b_l$, and a trailing partial dislocation, $b_t$. A set of basal stacking faults (BSFs) 44 are shown located in a region between the partial dislocations $b_l$, $b_t$. The BSFs 44 can be caused by the energy principle: $E_b \geq E_l + E_t + \Sigma_{sf}$, where $E_b$ is the energy of an edge dislocation 42; $E_l$ is the energy of the leading partial dislocation; $E_t$ is the energy of the trailing partial dislocation; and $\Sigma_{sf}$ is the energy of the stacking faults 44.

The energy associated with the threading edge dislocation $E_b$ is directly proportional to the square of the magnitude of the Burgers vector. For an AlN crystal layer, an edge dislocation 42 in the prism plane is characterized by a Burgers vector b, having an amplitude, |b|, equal to the crystal lattice constant a of AlN, which is approximately a=3.112 angstroms (A). In this case, the energy of the edge dislocation $E_b$ is proportional to $a^2$. Each partial dislocation $b_l$, $b_t$ has an amplitude of $a/\sqrt{3}$ and a corresponding energy $E_l$, $E_t$ proportional to $a^2/3$. As a result, the two partial dislocations $b_l$, $b_t$ have significantly less energy than the edge dislocation 42, e.g., $E_l + E_t = 2a^2/3 < E_b = a^2$. In AlN, the energy of a stacking fault $\Sigma_{sf}$ has been shown to be approximately 80 mJ/m², while the energy of a single edge dislocation 42 has been shown to be approximately 14 nJ/m. During the layer growth, the smallest incremental dislocation length is the lattice constant c, which for AlN is approximately 4.98 angstroms. Thus, the incremental edge dislocation energy for the distance c is given by $E_b = 70 \cdot 10^{-19}$ J=43 electron volts (eV). As described herein, the combined energies of the partial dislocations is smaller, e.g., per unit length, the combined energies $E_l$, $E_t$ are approximately two thirds of the energy of the edge dislocation 42, or approximately 9 nJ/m.

Since the partial dislocations $b_l$, $b_t$ lay in the basal c-plane, the incremental growth distance of the partial dislocations $b_l$, $b_t$ is the lattice constant a, from which it follows that $E_l + E_t \sim 28$ eV. Consequently, the overall energy savings for one step of growth is approximately 15 eV. A portion of the recovered energy is goes toward the energy of the stacking fault $\Sigma_{sf}$. An energy for the stacking fault, $\Sigma_{sf} = 15$ eV corresponds to a stacking fault area of approximately 1500 $A^2$. As a result, the partial dislocations $b_l$, $b_t$ propagate in the c-plane in close proximity to each other in order to preserve a favorable energy balance. An overall energy also is reduced by partially relieving misfit compressive or tensile stress 32 due to the misfit strain. For example, a compressive strain can increase as a function of the thickness of the film. The partial dislocations $b_l$, $b_t$ can play a role of misfit dislocations relieving stress in thick semiconductor layers.

Because of a lower energy, a dissociated edge dislocation in the (0001) plane will not turn back into the prism plane. Rather, the dislocation will grow out of the crystal 40 from an edge side. Additionally, dislocation regeneration can be further suppressed by grading the layer materials (e.g., AlGaN, superlattice structure, and/or the like). Therefore, using a SASM growth technique described herein, edge and screw dislocations can be dramatically decreased, e.g., by one or more orders of magnitude. Furthermore, for illustrative group III nitride semiconductor layers and multiple quantum well structures grown using a SASM growth technique described herein, a time resolved photoluminescence (TRPL) lifetime improved significantly (50-100 times), e.g., by up to approximately two nanoseconds.

In an embodiment, a surface of one or more layers can be patterned, which can be configured to provide an additional relaxation mechanism for reducing cracks and/or threading dislocations in a structure. For example, a surface of the substrate 12 (FIGS. 4A-4C) and/or the buffer layer 14 (FIGS. 4A-4B) can be patterned, e.g., using etching, masking, a combination of etching and masking, and/or the like. A layer, such as the buffer layer 14 and/or any layer located above the buffer layer, can be grown in multiple steps, one or more of which can include patterning. Such patterning can be achieved by etching and/or masking the layer, masking and subsequent overgrowth, by producing voids during overgrowth process, and/or the like. Regardless, the patterning can be configured to reduce an overall stress accumulated in the corresponding layer structure.

Figure 8A:
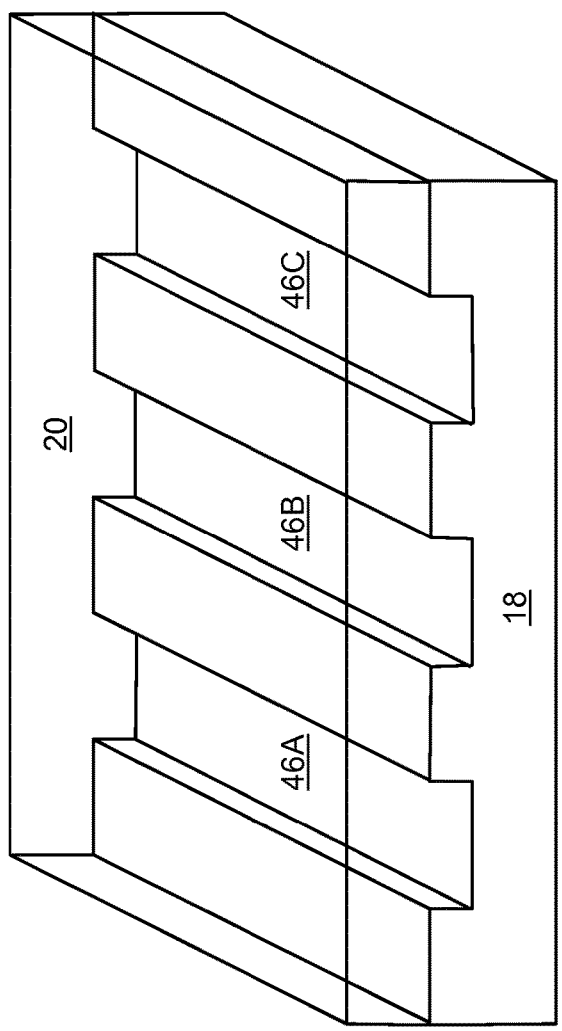

For example, FIGS. 8A and 8B show illustrative patterns of a surface of a compressive layer 18 with a tensile layer 20 grown thereon according to embodiments. In FIG. 8A, the surface of the compressive layer 18 is patterned with a plurality of stripes 46A-46C, while in FIG. 8B, the surface of the compressive layer 18 is patterned with a plurality of windows 48A-48F. However, it is understood that the stripe/window patterns are only illustrative of various patterns that can be utilized. Furthermore, it is understood that similar patterns can be formed on a surface of a substrate 12, a buffer layer 14, and/or a tensile layer 20 prior to the growth of a subsequent layer thereon. Regardless, each pattern can produce an interface where the layers 18, 20 have a common boundary in both a vertical direction of growth and in a lateral direction of the layer.

Figure 9A:
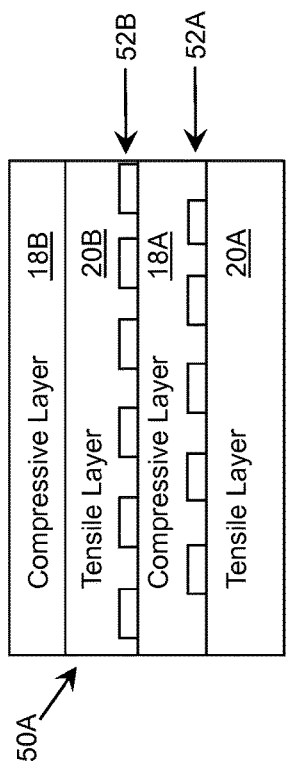
FIGS. 9A and 9B show illustrative patterning arrangements according to embodiments.
Figure 9B:
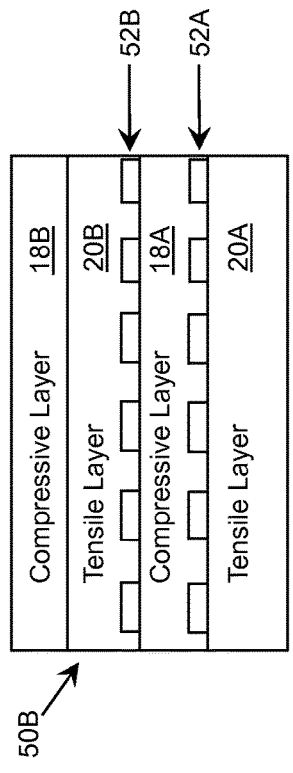

When patterning is employed on the surfaces of multiple layers, the relative positioning of the patterning elements and/or the patterns can be varied for the surfaces of adjacent patterned layers. For example, FIGS. 9A and 9B show illustrative patterning arrangements according to embodiments. In FIGS. 9A and 9B, an interface between a tensile layer 20A and a compressive layer 18A has a first pattern 52A, and an interface between the compressive layer 18A and a tensile layer 20B has a second pattern 52B. The patterns 52A, 52B can be formed by a plurality of patterning elements, for example, a series of masked domains or voids located at the respective interfaces. However, in the structure 50A, the patterning elements of the patterns 52A, 52B are laterally offset from one another, thereby forming a vertical checkerboard-like formation of the patterning elements. In contrast, in the structure 50B, the patterning elements of the patterns 52A, 52B are positioned at substantially the same lateral locations.

As discussed herein, aspects of the invention can be utilized to fabricate a device, such as an emitting device, a transistor, and/or the like. To this extent, FIG. 10 shows a schematic of an illustrative device heterostructure 60 according to an embodiment. In an embodiment, the heterostructure 60 includes a patterned substrate 62 with a buffer layer 64 located thereon. Additionally, the heterostructure 60 can include a set of additional layers 66, 68, 70, 72, 74, which are located (e.g., grown) on the buffer layer 64. In an embodiment, the set of additional layers 66, 68, 70, 72, 74 have alternating tensile and compressive stresses. In another embodiment, each of the set of additional layers 66, 68, 70, 72, 74 is formed of a group III nitride material.

As illustrated, a surface of the substrate 62 is patterned (e.g., with stripes as shown and described in conjunction with FIG. 8A). The buffer layer 64 can be grown on the patterned surface of the substrate 62 using, for example, a SASM growth process described herein. For example, the substrate 62 can be an AlN substrate on which the buffer layer 64 is grown using a slow-grading grown AlGaN superlattice structure (e.g., including at least 3-5 sets of superlattices) and a slow-grading grown AlGaN. Through the grading-grown AlGaN superlattice structure and AlGaN, a low dislocation density of approximately $10^8/cm^2$ was obtained at the interface of the buffer layer 64 and the layer 66.

In an embodiment, the heterostructure 60 comprises a full structure LED 60, which can comprise an ultraviolet LED 60. In this case, the LED 60 can include the buffer layer 64, on which is located a layer stack, which can include an n-type cladding layer 66 (e.g., an electron supply layer), an active region 68 (e.g., a multiple quantum well structure), a p-type electron blocking layer 70, a p-type cladding layer 72 (e.g., a hole supply layer), and a p-type contact 74. However, it is understood that this is only illustrative of various types of devices and layer structures that can be used according to embodiments.

It is understood that a device or a heterostructure used in forming a device including a structure described herein can be fabricated using any solution. For example, a device/heterostructure can be manufactured by obtaining (e.g., forming, preparing, acquiring, and/or the like) a substrate 62, forming (e.g., growing) a buffer layer 64 thereon, and growing a semiconductor heterostructure on the buffer layer 64 as described herein. Furthermore, the fabrication can include patterning a surface of the substrate 62, the buffer layer 64, and/or a semiconductor layer as described herein, the deposition and removal of a temporary layer, such as mask layer, the formation of one or more additional layers not shown, and/or the like. Additionally, one or more metal layers, contacts, and/or the like can be formed using any solution. The heterostructure/device also can be attached to a submount via contact pads using any solution. The fabrication of a device or a heterostructure can include one or more of various additional acts. For example, the fabrication can include removal of the foreign substrate and/or one or more of the layers after growth of a heterostructure.

The patterning of a layer can be performed using any solution. For example, the patterning can include defining a set of regions on a top surface of the layer for etching using, for example, photolithography to apply a photoresist defining the set of regions, or the like. The set of openings having a desired pattern can be formed, e.g., by etching in the set of defined regions of the layer. Subsequently, the photoresist can be removed from the surface. Such a process can be repeated one or more times to form a complete pattern on the layer. The patterning of a layer also can include applying (e.g., depositing) a mask (e.g., silicon dioxide, a carbon based material, or the like) over a second set of regions on the top surface of the layer. When the pattern also includes a set of openings, the second set of regions can be entirely distinct from the locations of the set of openings. Furthermore, as described herein, the formation of a layer can include multiple repetitions of the patterning process. In this case, each repetition can vary from the previous repetition in one or more aspects. For example, a repetition can include both applying a mask and forming openings on a surface, only forming openings, only applying a mask, and/or the like. Additionally, as described herein, the locations of the masked and/or opening portions for a repetition can be vertically offset from the locations of the adjacent repetition.

Figure 11:
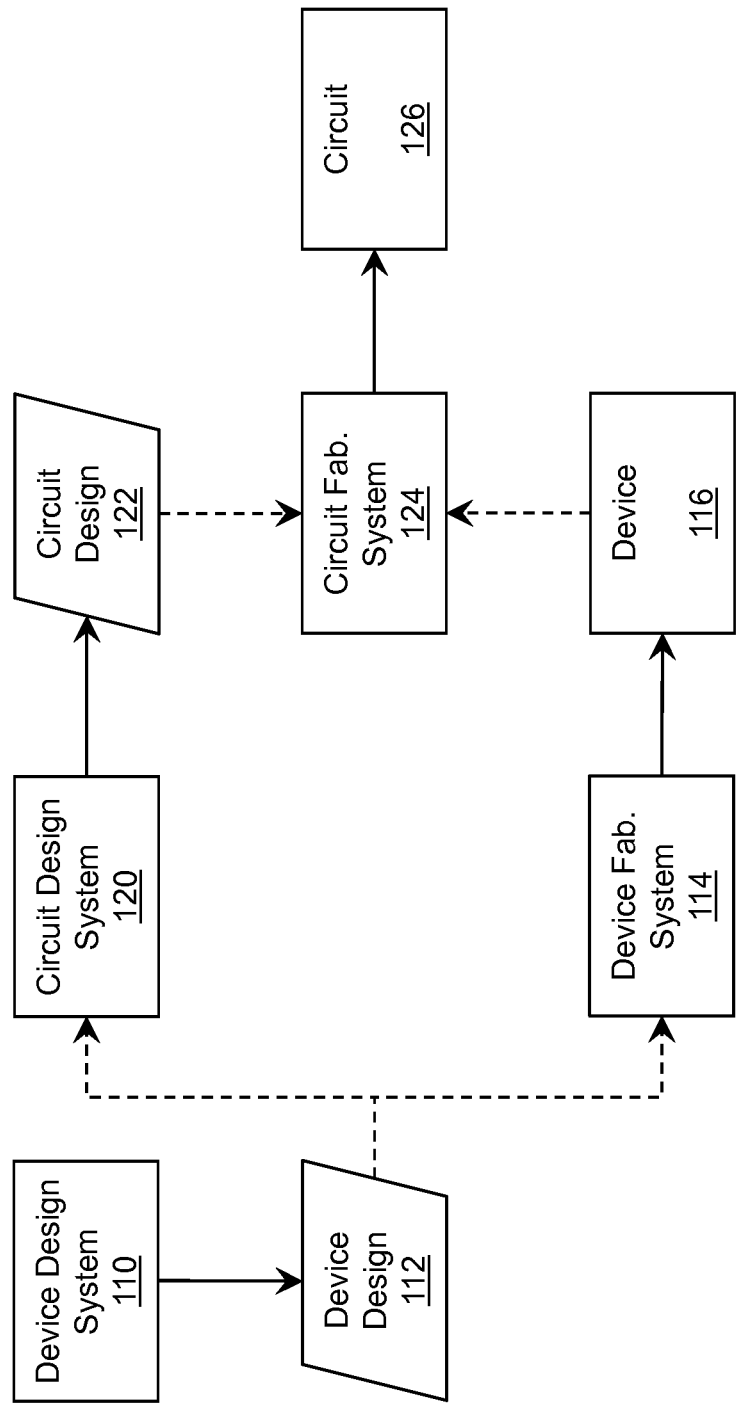
FIG. 11 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 11 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of fabricating a semiconductor structure, the method comprising:
   growing a plurality of semiconductor layers over a substrate using a set of epitaxial growth periods, wherein each epitaxial growth period includes:
   epitaxially growing a first semiconductor layer having one of: a tensile stress or a compressive stress; and
   epitaxially growing a second semiconductor layer having the other of: the tensile stress or the compressive stress directly on the first semiconductor layer, wherein the first and second semiconductor layers are formed of group III-V materials, wherein a molar fraction of a group III element in the group III-V material of the first semiconductor layer and a molar fraction of the group III element in the group III-V material of the second semiconductor layer differ by no more than approximately five percent, wherein a difference between a set of growth conditions used for the first and second semiconductor layers causes at least ten percent of an area of an interface between the first and second semiconductor layers to have a shear stress that is greater than a shear stress present between two group III nitride semiconductor layers having a lattice mismatch of 0.01%.

2. The method of claim 1, wherein the first semiconductor layer and the second semiconductor layer are formed of group III nitride materials and wherein a thickness of each of the first and second semiconductor layers is between approximately 1 and approximately 50 micrometers.

3. The method of claim 1, the fabricating further comprising growing a buffer layer directly on the substrate prior to the growing the plurality of semiconductor layers, wherein the first semiconductor layer is grown directly on the buffer layer.

4. The method of claim 3, wherein the growing the buffer layer uses a growth temperature between approximately 500 and approximately 1200 degrees Celsius and a growth rate between approximately 0.01 micrometers and approximately 10 micrometers per hour.

5. The method of claim 1, wherein each epitaxially growing action uses: a group III precursor flow rate between approximately 0.1 and approximately 200 micromoles per minute; a nitrogen precursor flow rate between approximately 100 and 10000 standard cubic centimeters per minute (SCCM); and a pressure between approximately 1 and 760 Torr.

6. The method of claim 1, wherein the epitaxially growing the first semiconductor layer uses: a molar ratio of group V precursors to group III precursors (V/III ratio) between approximately 10 and approximately 1000; a growth temperature between approximately 500 and approximately 1800 degrees Celsius; and a pressure between approximately 1 and 760 Torr.

7. The method of claim 1, wherein the first and second semiconductor layers have a lattice mismatch of at least 0.05%.

8. The method of claim 1, wherein a molar ratio of group V precursors to group III precursors used during the epitaxially growing the first semiconductor layer and a molar ratio of group V precursors to group III precursors used during the epitaxially growing the second semiconductor layer differ by at least ten percent.

9. The method of claim 1, wherein the epitaxially growing the first semiconductor layer and the epitaxially growing the second semiconductor layer use growth rates that differ by at least ten percent.

10. The method of claim 1, wherein the epitaxially growing the first semiconductor layer and the epitaxially growing the second semiconductor layer use substantially the same growth temperature.

11. The method of claim 1, wherein the epitaxially growing the first semiconductor layer and the epitaxially growing the second semiconductor layer use growth temperatures that differ by at least two percent when measured in degrees Celsius.

12. The method of claim 1, wherein a thickness of each of the first semiconductor layer and the second semiconductor layer is greater than a critical thickness to avoid pseudomorphic growth.

13. The method of claim 1, wherein the growing the plurality of semiconductor layers further includes forming a pattern on a surface of the first semiconductor layer prior to epitaxially growing the second semiconductor layer.

14. The method of claim 1, wherein the growing the plurality of semiconductor layers uses a plurality of epitaxial growth periods, and wherein at least one of: the tensile stress or the compressive stress changes from one epitaxial growth period to another epitaxial growth period.

15. A method of fabricating a semiconductor structure, the method comprising:
  growing a plurality of group III nitride semiconductor layers over a substrate using a set of epitaxial growth periods, wherein each epitaxial growth period includes:
    epitaxially growing a first group III nitride semiconductor layer having one of: a tensile stress or a compressive stress; and
    epitaxially growing a second group III nitride semiconductor layer having the other of: the tensile stress or the compressive stress directly on the first semiconductor layer, wherein a molar fraction of a group III element in the group III-V material of the first semiconductor layer and a molar fraction of the group III element in the group III-V material of the second semiconductor layer differ by no more than approximately five percent, wherein a molar ratio of group V precursors to group III precursors used during the epitaxially growing the first semiconductor layer and a molar ratio of group V precursors to group III precursors used during the epitaxially growing the second semiconductor layer differ by at least ten percent, and wherein at least one of: a thickness of at least one of the first or second semiconductor layers, a lattice mismatch between the first and second semiconductor layers, or a difference between a set of growth conditions used for the first and second semiconductor layers is selected to create a shear stress in at least ten percent of an area of an interface between the first and second semiconductor layers that turns at least some dislocations in the first semiconductor layer from a direction primarily in a direction of a c-axis to a direction primarily in a c-plane of the at least one of the first or second semiconductor layers.

16. The method of claim 15, wherein the shear stress in the at least ten percent of the area of the interface between the first and second semiconductor layers exceeds approximately ten MegaPascal (MPa).

17. The method of claim 15, wherein the first and second group III nitride semiconductor layers are one of: aluminum nitride or aluminum gallium nitride.

* * * * *